US007761280B2

(12) United States Patent
Nightingale et al.

(10) Patent No.: US 7,761,280 B2
(45) Date of Patent: Jul. 20, 2010

(54) DATA PROCESSING APPARATUS SIMULATION BY GENERATING ANTICIPATED TIMING INFORMATION FOR BUS DATA TRANSFERS

(75) Inventors: Andrew Mark Nightingale, Cambridge (GB); Daren Croxford, Cambridgeshire (GB)

(73) Assignee: ARM Limited, Cambridge (GB)

( * ) Notice: Subject to any disclaimer, the term of this patent is extended or adjusted under 35 U.S.C. 154(b) by 1792 days.

(21) Appl. No.: 10/802,032

(22) Filed: Mar. 17, 2004

(65) Prior Publication Data

US 2005/0209839 A1    Sep. 22, 2005

(51) Int. Cl.
*G06G 7/62* (2006.01)
*G06F 17/50* (2006.01)

(52) U.S. Cl. .......................................... 703/19; 703/13
(58) Field of Classification Search .................. 703/13, 703/19
See application file for complete search history.

(56) References Cited

U.S. PATENT DOCUMENTS 5,140,680 A * 8/1992 Best ........................... 710/110
6,393,500 B1 * 5/2002 Thekkath ..................... 710/35
6,490,642 B1 * 12/2002 Thekkath et al. ............. 710/110
2002/0163932 A1 * 11/2002 Fischer et al. ............... 370/465
2005/0131666 A1 * 6/2005 Tsai et al. .................... 703/17

* cited by examiner

*Primary Examiner*—Paul L Rodriguez
*Assistant Examiner*—Nithya Janakiraman
(74) *Attorney, Agent, or Firm*—Nixon & Vanderhye P.C.

(57) ABSTRACT

Simulation of the operation of a data processing apparatus having a number of master logic units and slave logic units coupled via a bus is provided. The data processing apparatus performs data transfers between the master logic units and the slave logic units over the bus. Anticipated timing information for each successive data transfer over the bus is generated by assuming that each successive data transfer can occur with exclusive access to the bus, determining whether the anticipated timing information indicates that two or more concurrent data transfers would occur on the bus, and in the event that the anticipated timing information indicates that two or more concurrent data transfers would occur on the bus, generating revised timing information for those data transfers, the revised timing information being generated using bus status information until those data transfers have been completed.

46 Claims, 8 Drawing Sheets

DATA PROCESSING APPARATUS SIMULATION BY GENERATING ANTICIPATED TIMING INFORMATION FOR BUS DATA TRANSFERS

FIELD OF THE INVENTION

The present invention relates to data processing apparatus simulation and in particular to techniques for simulating the operation of a data processing apparatus to determine timing information of data transfers.

BACKGROUND OF THE INVENTION

Techniques for simulating the operation of a data processing apparatus are known. One such simulation technique is to generate a software model representative of the data processing apparatus. The software model models each component unit of the data processing apparatus. The software model can then be employed to examine the expected interactions of the component units of the data processing apparatus under different conditions.

Such software models typically simulate the functionality provided by the component units of the data processing apparatus. Other software models also seek to model the timing relationship between the different component units of the data processing apparatus. Hence, information relating to the operation and timing of the data processing apparatus can be generated using these software models.

It will be appreciated that it is possible to simulate the behaviour of a data processing apparatus to various degrees of detail. A relatively simplistic model may provide just limited information relating to the operation of the data processing apparatus under a particular set of operating conditions in question, but this type of model may operate relatively quickly. Providing more detailed information on the behaviour of the data processing apparatus requires a more complex model. It will be appreciated that typically the execution time of a more complex model will be much longer than that of the more simplified version. Accordingly, when considering how to model the behaviour of a data processing apparatus under specified conditions, it will be appreciated that there is a trade off between the accuracy of the model and the speed at which the model can operate.

It is desired to provide an improved technique for simulating the operation of a data processing apparatus.

SUMMARY

According to a first aspect of the present invention there is provided a method of simulating the operation of a data processing apparatus to determine timing information of data transfers, the data processing apparatus comprising a number of master logic units and slave logic units coupled via a bus, the data processing apparatus being operable to perform the data transfers between the master logic units and the slave logic units over the bus, the method comprising the steps of: generating anticipated timing information for each successive data transfer over the bus by assuming that each successive data transfer can occur with exclusive access to the bus; determining whether the anticipated timing information indicates that two or more concurrent data transfers would occur on the bus; and in the event that the anticipated timing information indicates that two or more concurrent data transfers would occur on the bus, generating revised timing information for those data transfers, the revised timing information being generated using bus status information until those data transfers have been completed.

The present inventors recognized that during the operation of many data processing apparatus, the probability that a data transfer will occur between a master logic unit and a slave logic unit pair over the bus without the bus being requested for use by other logic unit pairs is statistically relatively high. Hence, for the majority of data transfers it is accurate to assume that the data transfer will occur with exclusive access to the bus. Assuming that each data transfer can occur with exclusive access to the bus significantly decreases the complexity when generating the anticipated timing information for each data transfer. The complexity is decreased because the need to precisely model the generation of signals used to request the bus by every logic unit in the data processing apparatus is obviated. Furthermore, the complexity is decreased because there is no need to precisely model the operation of any bus arbitration logic responsive to those signals. Accordingly, because the complexity of the model which generates the anticipated timing information can be low, the speed at which the anticipated timing information is generated is high. Also, because the majority of the data transfers will in fact occur under these conditions, the majority of the anticipated timing information will be accurate.

In accordance with the present invention, the anticipated timing information for each data transfer is also used to determine whether two or more data transfers will occur on the bus at the same time. In the event that the anticipated timing information indicates that more than one data transfer will occur on the bus at the same time it is then assumed that the anticipated timing information is inaccurate and revised timing information is then generated.

The revised timing information is generated for at least the data transfers which, for at least some period of the data transfer, have been determined from the anticipated timing information to occur on the bus at the same time. This revised timing information is generated using information relating to the status of the bus during those data transfers. It will be appreciated that the generation of the revised timing information may result in increased complexity. The complexity is increased because of the need to model the generation of bus status information. Accordingly, because the complexity of the model which generates the revised timing information may be higher, the speed at which the revised timing information is generated may be lower. However, as mentioned above, only a minority of the data transfers will in fact occur under these conditions.

Accordingly, instead of generating only anticipated timing information, which is quick to generate but which may be inaccurate for many data transfers, or generating only more detailed timing information, which is slower to generate but which will be accurate for all data transfers, it will be appreciated that the present technique provides an optimised technique which is both fast and accurate. The technique is fast because only those data transfers which will occur simultaneously need use the slower technique of generating revised timing information, otherwise the extremely efficient technique of generating anticipated timing information can be used. The technique is accurate because when a data transfer occurs with exclusive access to the bus the anticipated timing information will be entirely accurate, and for situations where concurrent data transfers occur revised timing information is generated.

In one embodiment, the step a) further comprises the step of generating anticipated timing information for each successive data transfer between one master logic unit and one slave logic unit over the bus to which that master logic unit and that slave logic unit have exclusive access.

In one embodiment, the anticipated timing information comprises a data transfer window indicative of the time during which that data transfer will occur over the bus.

Using a data transfer window is a simple technique for identifying whether the bus is expected to be in use at any particular point in time and for assisting the determination of whether concurrent data transfers are expected to occur.

In one embodiment, the anticipated timing information comprises data transfer commencement information indicative of the time at which that data transfer will commence on the bus and data transfer completion information indicative of the time at which that data transfer will complete on the bus.

Providing the start and end time for each particular data transfer also assists in identifying whether the bus is expected to be in use at any particular point in time and in determining whether concurrent data transfers are expected to occur.

In one embodiment, each data transfer comprises the transfer of a number of data values over the bus and the anticipated timing information comprises data value transfer information indicative of the time at which each data value will be transferred over the bus.

Accordingly, where the data transfer comprises the transfer of a number of data values the data value transfer information is arranged to provide details of when it is anticipated that each of those particular data values will be transferred over the bus.

In one embodiment, the step b) further comprises the step of comparing the anticipated timing information for each successive data transfer to determine whether two or more concurrent data transfers would occur on the bus.

By simply comparing the anticipated timing information for each data transfer it is possible to determine whether or not two or more data transfers will occur on the bus at the same time.

In one embodiment, the step b) further comprises the step of determining whether two or more concurrent data transfers would occur on the bus by determining whether the anticipated timing information indicates that one data transfer will not complete prior to another data transfer commencing.

It will be appreciated that if the anticipated timing information indicates that one data transfer will not complete before another commences then it is likely that a concurrent data transfer will occur.

In one embodiment, the step c) further comprises the step of generating bus status information indicative of the status of the bus during at least a period when the anticipated timing information indicates that two or more concurrent data transfers would occur on the bus.

Generating bus status information during the period when it is expected that concurrent data transfers will occur assists in generating the revised timing information.

In one embodiment, the bus status information includes information indicative of which master logic unit and slave logic unit pair have access to the bus at any point in time during at least the period.

Providing information which indicates which of the master and slave logic units have access to the bus at each point in time assists in determining which of the data transfers will be occurring during the period.

In one embodiment, the step c) further comprises the step determining from the generating bus status information which of those data transfers will occur on the bus at any point in time during at least the period.

Providing information which indicates which of the master and slave logic units have access to the bus at each point in time also assists in generating the revised timing information.

In one embodiment, the step c) further comprises the step of generating revised timing information indicative of the time during which each of those data transfers occur over the bus.

According to a second aspect of the present invention there is provided a method of simulating the operation of a data processing apparatus using a software model to determine timing information of data transfers, the data processing apparatus comprising a number of master logic units and slave logic units coupled via a bus, the data processing apparatus being operable to perform the data transfers between the master logic units and the slave logic units over the bus, the method comprising the steps of: a) in response an indication that a data transfer is to occur, generating data transfer information indicative of the data transfer using a master logic unit model and a slave logic unit model; b) generating anticipated timing information from the data transfer information using the master logic unit model and the slave logic unit model, the anticipated timing information being generated by assuming that the data transfer will occur with exclusive access to the bus; c) determining from the anticipated timing information whether two or more concurrent data transfers will occur; and d) in the event that is it anticipated that two or more concurrent data transfers will occur, generating revised timing information for those data transfers using the master logic unit model and the slave logic unit model, the revised timing information being generated by modelling the status of the bus during at least the period when it is anticipated that two or more concurrent data transfers will occur.

According to a third aspect of the present invention there is provided a system for simulating the operation of a data processing apparatus to determine timing information of data transfers, the data processing apparatus comprising a number of master logic units and slave logic units coupled via a bus, the data processing apparatus being operable to perform the data transfers between the master logic units and the slave logic units over the bus, the system comprising: a master logic unit software model and a slave logic unit software model each being operable, in response an indication that a data transfer is to occur, to generate data transfer information indicative of the data transfer, the master logic unit software model and the slave logic unit software model being further operable in a default mode to generate anticipated timing information from the data transfer information, the anticipated timing information being generated by assuming that the data transfer will occur with exclusive access to the bus and in a selected mode, when it is anticipated that two or more concurrent data transfers will occur, to generate revised timing information for those data transfers, the revised timing information being generated by modelling the status of the bus during at least the period when it is anticipated that the two or more concurrent data transfers will occur; and a bus software model operable to determine from the anticipated timing information whether two or more concurrent data transfers will occur and, when it is anticipated that two or more concurrent data transfers will occur, to signal the master logic unit software model and the slave logic unit software model to switch from the default mode to the selected mode.

According to a fourth aspect of the present invention there is provided a computer program for simulating the operation of a data processing apparatus to determine timing information of data transfers, the data processing apparatus comprising a number of master logic units and slave logic units coupled via a bus, the data processing apparatus being operable to perform the data transfers between the master logic units and the slave logic units over the bus, the computer program comprising: a master logic unit software model and a slave logic unit software model each being operable, in response an indication that a data transfer is to occur, to generate data transfer information indicative of the data transfer, the master logic unit software model and the slave logic unit software model being further operable in a default mode to generate anticipated timing information from the data transfer information, the anticipated timing information being generated by assuming that the data transfer will occur with exclusive access to the bus and in a selected mode, when it is anticipated that two or more concurrent data transfers will occur on the bus, to generate revised timing information for those data transfers, the revised timing information being generated by modelling the status of the bus during at least the period when it is anticipated that the two or more concurrent data transfers will occur; and a bus software model operable to determine from the anticipated timing information whether two or more concurrent data transfers will occur and, when it is anticipated that two or more concurrent data transfers will occur, to signal the master logic unit software model and the slave logic unit software model to switch from the default mode to the selected mode.

DETAILED DESCRIPTION

Figure 1:
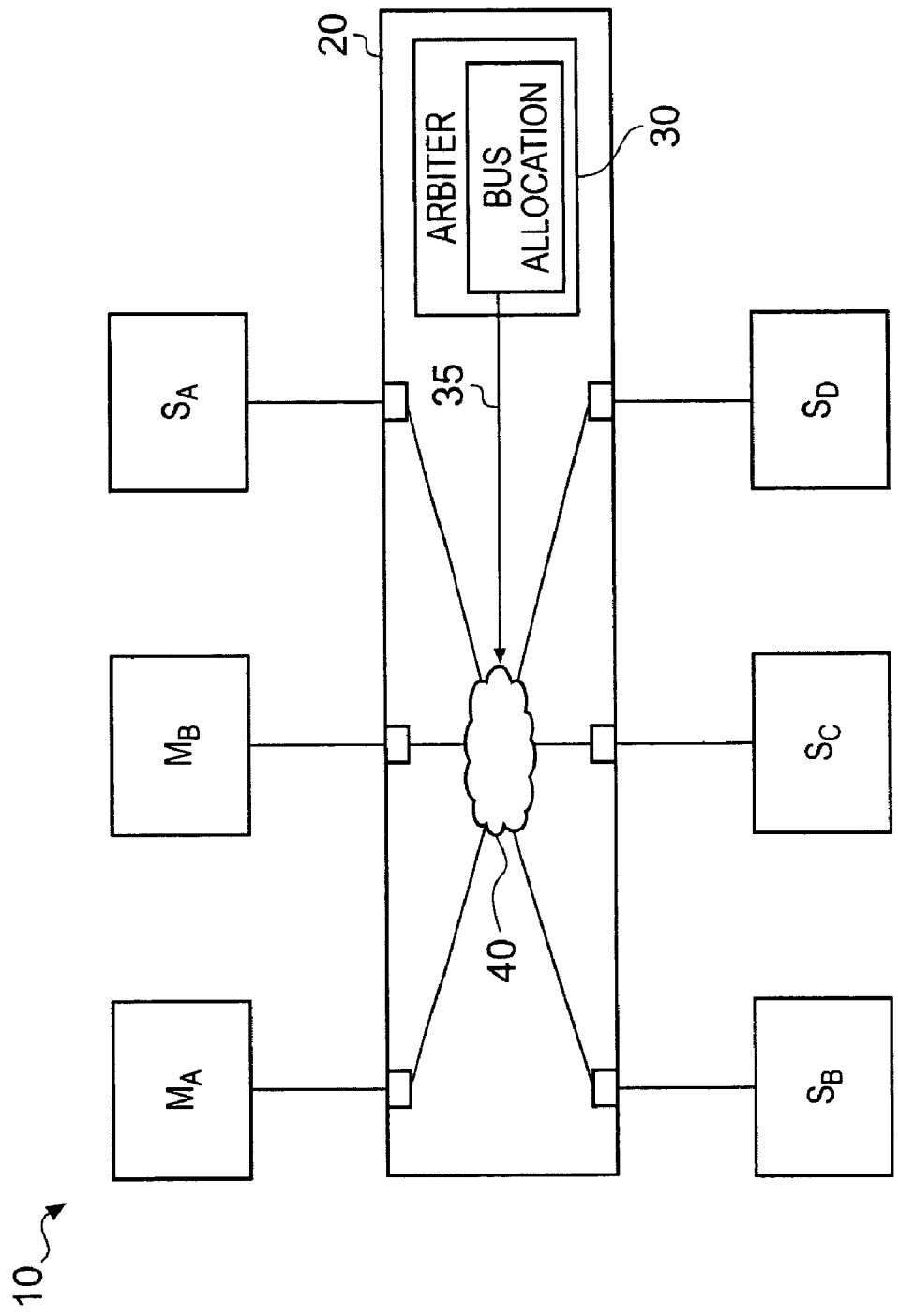
FIG. 1 is a block diagram showing the arrangement of an example data processing apparatus to be simulated.

FIG. 1 illustrates a data processing apparatus, generally 10, whose operation is to be simulated. The data processing apparatus 10 comprises master logic units $M_A$ and $M_B$ and slave logic units $S_A$, $S_B$, $S_C$ and $S_D$, it will be appreciated that further, or fewer, master logic units and slave logic unit could be provided. Each of the logic units are coupled to bus 20 which enables any master logic unit to be coupled with any slave logic unit. It will be appreciated that the bus 20 may comprise a bus matrix. Data transfers can occur between any master logic unit and any slave logic unit. Data transfers are initiated by the master logic units and the slave logic units are operable to respond to such data transfers.

The bus 20 comprises arbiter logic 30 which is operable to determine which of the logic units may have access to the bus at any given point in time. The arbiter logic 30 will make that determination in response to request signals received from the logic units for access to the bus to enable a data transfer to take place. The arbiter logic 30 will then, in accordance with any one of many well-known arbitration schemes, determine which of the logic units should be given access to the bus to perform their data transfer. Once that determination has been made a bus allocation signal is provided over the path 35 to bus interconnect logic 40 to allocate the bus. Thereafter, the data transfer will take place. Once the data transfer has occurred, the arbiter logic 30 will determine which of the logic units may then have access to the bus based on the requests received from the logic units and the arbitration scheme, and a bus allocation signal is provided over the path 35 to bus interconnect logic 40 to allocate the bus.

Figure 2:
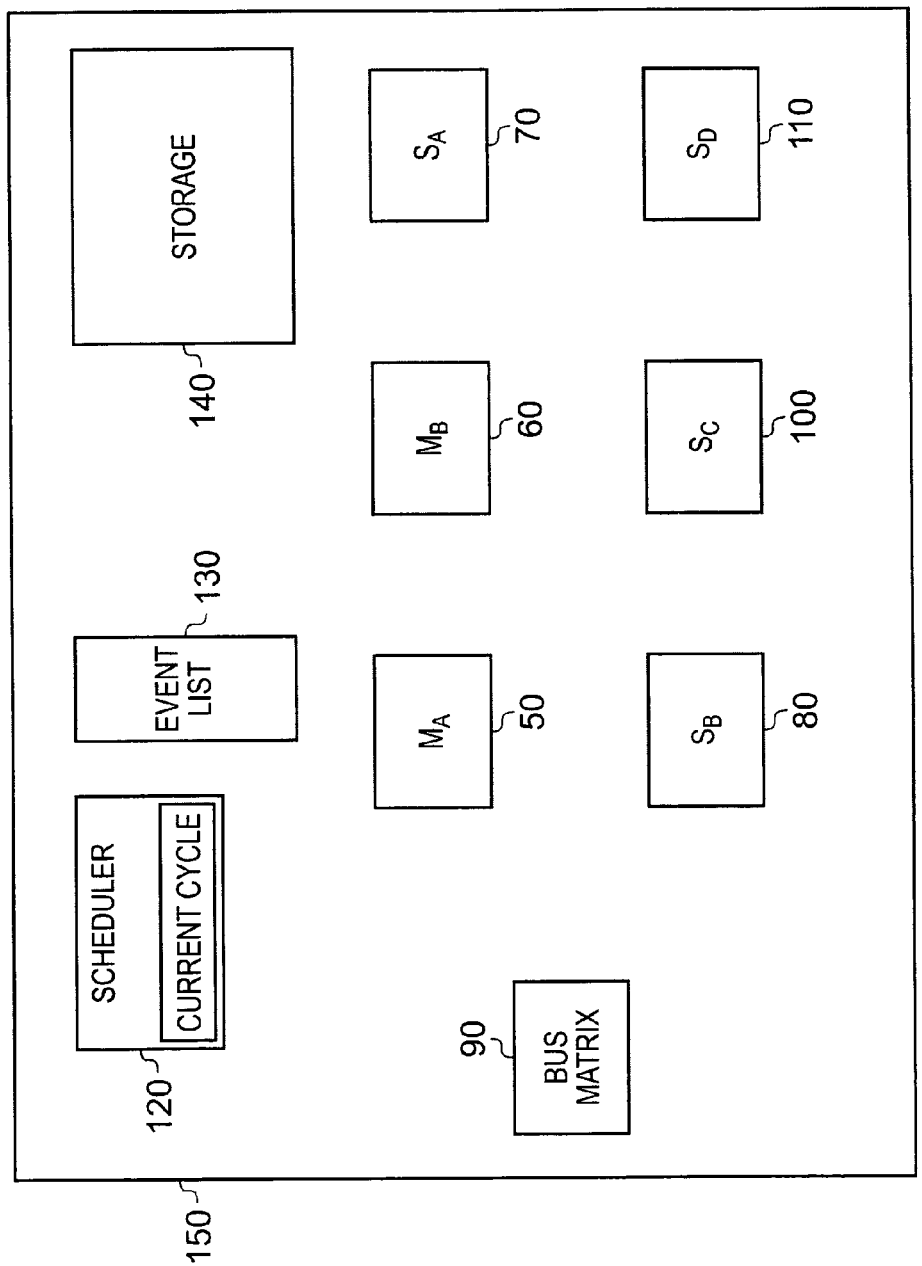
FIG. 2 illustrates schematically the arrangement of a model according to one embodiment which simulates the operation of the data processing apparatus of FIG. 1.

FIG. 2 illustrates schematically the arrangement of a SystemC model 150 which simulates the operation of the data processing apparatus of FIG. 1. Whilst the embodiments are described with reference to SystemC modelling, it will be appreciated that any other suitable modelling scheme could be used.

Each component unit of the data processing apparatus 10 is represented by an associated software model. For example, the master logic unit $M_A$ is represented by a master logic unit model 50, master logic unit $M_B$ is represented by a master logic unit model 60, slave logic unit $S_A$ is represented by a slave logic unit model 70, slave logic unit $S_B$ is represented by a slave logic unit model 80, slave logic unit $S_C$ is represented by a slave logic unit model 100, slave logic unit $S_D$ is represented by a slave logic unit model 110 and bus 20 is represented by a bus model 90.

In addition, in the simulation environment, in this case SystemC, there is provided a scheduler 120, an event list 130 and information storage 140. The scheduler 120 co-ordinates the operation of each model within the SystemC model 150 using the event list 130. The scheduler 120 maintains certain information used by all the models, including information relating to the current simulated clock cycle. The scheduler 120 is responsive to a particular sequence of instructions to be simulated by the SystemC model 150 and populates the event list 130. Entries in the event list 130 are sequentially accessed to cause function calls to the models to be executed. The models respond to the function calls, access any required information from other models or from the information storage 140 and perform the requested function. This process continues until the SystemC model 150 is halted or until the simulation is complete.

Figure 3:
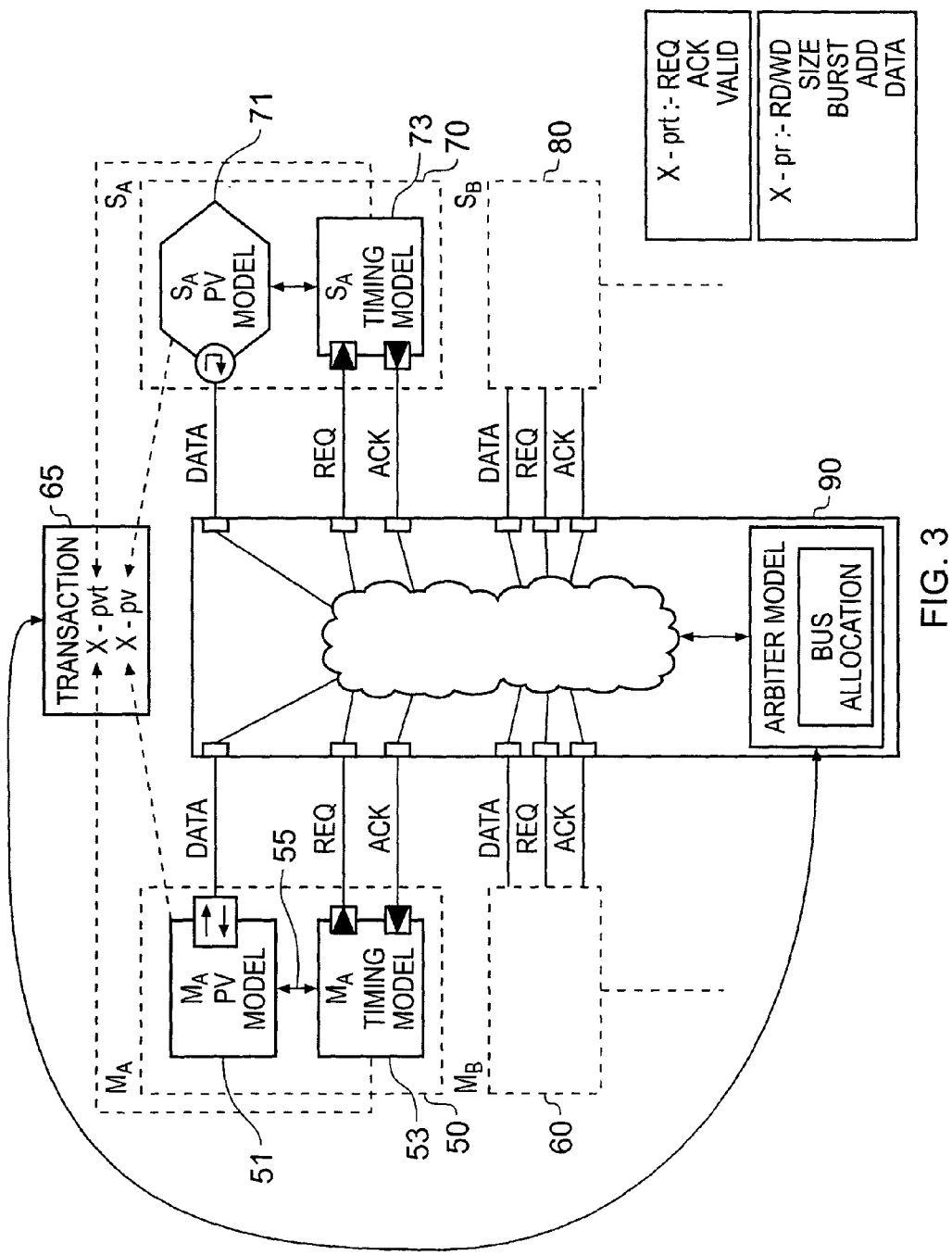
FIG. 3 illustrates in more detail the arrangement of a model of FIG. 2.

FIG. 3 illustrates in more detail the arrangement of the model of FIG. 2.

Each of the models within the SystemC model 150 is formed by a pair of model components or sub-models. For example, within the master logic unit model 50 there is provided a $M_A$ programmers view model 51 and a $M_A$ timing model 53. Each pair of sub-models are operable to pass information to each other over a path 55.

Each programmers view model functionally simulates the operation of the associated logic unit. The $M_A$ programmers view model 51 can provide functional information relating to a particular data transfer by simulating the functions performed by the master logic unit $M_A$. Such function information includes, for example, information indicative of the data which would be provided by the master logic unit $M_A$ during the data transfer.

Each timing model provides timing information associated with the functions being performed by the associated logic unit. The $M_A$ timing model 53 provides timing information for a simulated data transfer over the bus for one of two different scenarios.

In the first scenario, the $M_A$ timing model 53 generates anticipated or expected timing information for the data transfer by assuming that the data transfer can occur with exclusive access to the bus.

In the second scenario, the $M_A$ timing model 53 generates revised or adjusted timing information by simulating the timing and status of the signals on a clock cycle by clock cycle basis which would be provided by the master logic unit $M_A$ when requesting access to the bus. As will be explained in more detail below, these signals in conjunction with signals from other timing models, are used by the bus model 90 to determine which logic unit will gain access to the bus during any particular simulated clock cycle and to generate revised timing information for the data transfers.

In overview, the operation of the SystemC model 150 is as follows. The scheduler 120 is responsive to a particular sequence of instructions to be simulated by the SystemC model 150. When it is determined that an instruction will cause a data transfer to occur, the scheduler 120 causes an entry to be made in the event list which causes a function call to be made to the appropriate master logic unit model.

On receipt of the function call a master function unit model will generate a transaction 65. The transaction 65 is typically stored in the information storage area 140 in an appropriate location of the memory of the data processing apparatus running the SystemC model 150. A pointer to the transaction 65 is passed between the model components. Function calls to further models cause fields in the transaction 65 to be read and updated to provide information relating to the simulated the data transfer such as details of the data transfer and timing information relating to that data transfer. Once all the appropriate fields in the transaction 65 have been completed and the function calls are complete for that data transfer then control returns to the scheduler 120. The operation of the SystemC model 150 will be described in more detail below with reference to FIGS. 5A to 5D.

The transaction 65 comprises two sets of fields. The first set of fields X_pv contain functional information relating to the simulated data transfer which is completed the programmers view models. The second set of fields X_pvt contain timing information relating to the simulated the data transfer which is completed by the timing models.

Typically, the first set of fields X_pv store functional information relating to the data transfer. In particular, these fields contain details indicating whether the data transfer is a read or a write operation; the size of each data value to be transferred; the burst or number of data values for the data transfer; the address of the first data value to be transferred; and the data values themselves.

The second set of data value fields X_pvt store timing information relating to the data transfer. In particular, these fields contain details indicating when it is anticipated that a control signal will transition to indicate that a request for the bus will be made, and details indicating when it is anticipated that a control signal will transition to indicate that access to the bus will be granted. A valid field is also provided which indicates whether the anticipated timing information is considered to be valid or not as will be described in more detail with reference to FIG. 4.

Figure 4:
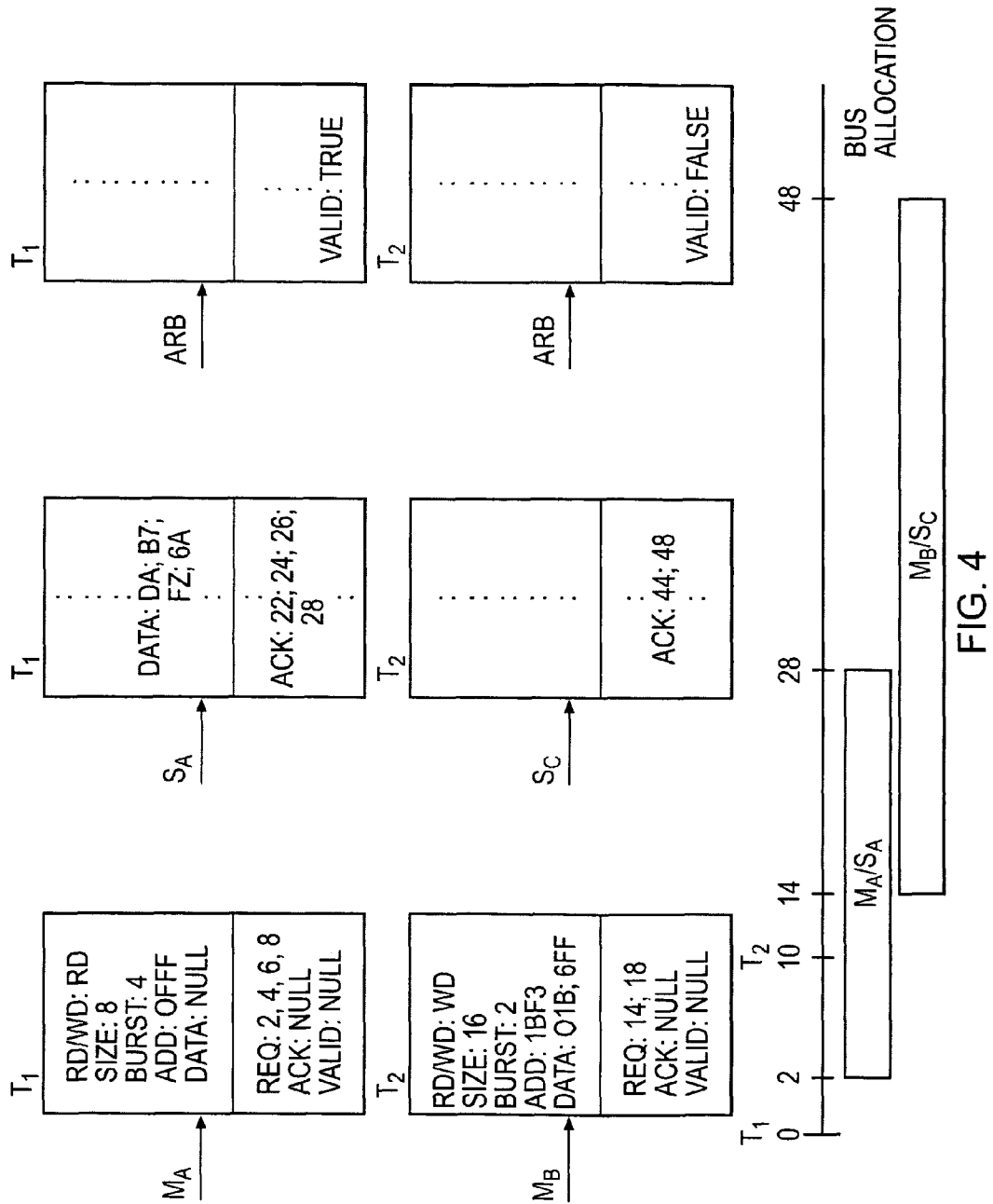
FIG. 4 illustrates the configuration of transactions generated by the models illustrated in FIG. 3.

FIG. 4 illustrates the operation of the SystemC model 150 during two successive simulated data transfers which result in a bus conflict. As mentioned above, in many data processing apparatus, such bus conflicts which are caused by two or more concurrent data transfers, will occur relatively rarely. In most situations, the data transfers will occur with exclusive use of the bus.

Accordingly, the SystemC model 150 will initially simulate each data transfer and generate anticipated timing information under the assumption that each data transfer will occur without a bus conflict occurring, since this is the most likely outcome. The SystemC model 150 then uses that anticipated timing information to test whether the assumption that each data transfer without a bus conflict occurring is correct. In the event that a bus conflict is expected then the data transfers can be resimulated by the timing models in a way which simulates the exact operation of the bus 90 in order to generate revised timing information. Example operations follow.

In response to a particular instruction in the sequence of instructions, the scheduler 120 determines that at clock cycle 0, an instruction will be executed which will cause master logic unit $M_A$ to read four, 8-bit data values from memory location 0FFF (hex) of slave logic unit $S_A$. Accordingly, the scheduler 120 will cause an appropriate entry to be made in the event list 130.

At simulated clock cycle 0, a function call is made to $M_A$ programmers view model 51 indicating that a read operation is to be performed.

The $M_A$ programmers view model 51 generates and completes a number of fields in a transaction $T_1$: the Read/Write field is annotated with "read"; the Size field is annotated with the value "8"; the Burst field is annotated with the value "4"; the Address field is annotated with "0fff"; and the Data field, the Ack (Acknowledge) field and the Valid field are each annotated with a "null" since these values are to be completed by other models. Thereafter a function call is made to the $M_A$ timing model 53.

The $M_A$ timing model 53 receives details of the data transfer and generates the values "2; 4; 6; 8" which are used to annotate the Request field, indicating that it is anticipated that request signals will be asserted at clock cycles 2, 4, 6 and 8 respectively for each of the four data transfers. The values 2, 4, 6, and 8 are generated by the $M_A$ timing model 53 which determines for that particular data transfer when the request signals will be generated assuming that the master logic unit $M_A$ will have exclusive access to the bus. Thereafter, the function call is completed and control passes back to the $M_A$ programmers view model 51. The $M_A$ programmers view model 51 then makes a function call to the bus model 90, which then calls the $S_A$ programmers view model 71.

The $S_A$ programmers view model 71 will receive details of the transaction $T_1$ and will generate the appropriate data values to be annotated in the Data field, in this example the values "0A; B7; F2; 6A" are generated. Thereafter, a function call is made to the $S_A$ timing model 73.

The $S_A$ timing model 73 receives details of the data transfer and generates the values "22; 24; 26; 28" which are used to annotate the Ack field, indicating that it is anticipated that acknowledge signals will be asserted at clock cycles 22, 24, 26 and 28 respectively for the four data transfers. The values 22, 24, 26, and 28 are generated by the $S_A$ timing model 73 which determines when the acknowledge signals will be generated assuming that the slave logic unit $S_A$ will have exclusive access to the bus. Accordingly, the period from clock cycle two, which is when the first request signal is to be asserted, to clock cycle 28, which is when the last acknowledge signal is to be asserted, is anticipated to be allocated to the data transfer between the master logic unit $M_A$ and the slave logic unit $S_A$. Thereafter, the function call is completed and control passes back to the $S_A$ programmers view model 71. The $S_A$ programmers view model 71 then passes control back to the bus model 90.

An arbiter model within the bus model 90 will determine from the transaction whether a bus conflict will occur due to two or more concurrent data transfers being anticipated. In this case, since this is the first data transfer to be performed, the arbiter model will determine that based on the current information it has available, the timing information is valid and will mark the valid field as being "true" to indicate that no conflict is expected.

Thereafter, in response to a particular instruction in the sequence of instructions, the scheduler 120 determines that at clock cycle 10, an instruction will be executed which will cause master logic unit $M_B$ to write two, 16-bit data values to memory location 1BF3 (hex) of slave logic unit $S_C$. Accordingly, the scheduler 120 will cause an appropriate entry to be made in the event list 130.

At clock cycle 10, a function call is made to $M_B$ programmers view model indicating that a write operation is to be performed.

The $M_B$ programmers view model generates and completes a number of fields in a transaction $T_2$: the Read/Write field is annotated with "write"; the Size field is annotated with the value "16"; the Burst field is annotated with the value "2"; the Address field is annotated with "1BF3"; the Data field is annotated with "01B; 6FF", the Ack field and the Valid field are each annotated with a "null" since these values are to be completed by other models. Thereafter, a function call is made to the $M_B$ timing model.

The $M_B$ timing model receives details of the data transfer and generates the values "14; 18" which are used to annotate the Request field, indicating that it is anticipated that request signals will be asserted at clock cycles 14 and 18 respectively for each of the two data transfers. The values 14 and 18 are generated by the $M_B$ timing model which determines when the request signals will be generated assuming that the master logic unit $M_B$ will have exclusive access to the bus. Thereafter, the function call is completed and control passes back to the $M_B$ programmers view model. The $M_B$ programmers view model then makes a function call to the bus model 90, which then calls the $S_C$ programmers view model.

The $S_C$ programmers view model will receive details of the transaction $T_2$ and a function call is made to the $S_C$ timing model.

The $S_C$ timing model receives details of the data transfer and generates the values "44; 48" which are used to annotate the Ack (Acknowledge) field, indicating that it is anticipated that acknowledge signals will be asserted at clock cycles 44 and 48 respectively for the two data transfers. The values 44 and 48 are generated by the $S_C$ timing model which determines when the acknowledge signals will be generated assuming that the slave logic unit $S_C$ will have exclusive access to the bus. Accordingly, the period from clock cycle 14, which is when the first request signal is to be asserted, to clock cycle 48, which is when the last acknowledge signal is to be asserted, is anticipated to be allocated to the data transfer between the master logic unit $M_B$ and the slave logic unit $S_C$. Thereafter, the function call is completed and control passes back to the $S_C$ programmers view model. The $S_C$ programmers view model then passes control back to the bus model 90.

The arbiter model within the bus model 90 will determine from the transaction whether a bus conflict will occur due to two or more concurrent data transfers being anticipated. In this case, it is clear that it is anticipated that from at least clock cycle 14 to at least clock cycle 28 a concurrent data transfer is expected occur. Accordingly, the arbiter model will annotate the valid field to be set to "false" to indicate that the anticipated timing information cannot be valid since such a concurrent data transfer would not in fact be able to occur and, as will be explained in more detail below with reference to FIGS. 5A to 5D, portions of the timing models and bus model 90 will be invoked to determine revised timing information for at least these data transfers. However, it will be appreciated that when the anticipated timing information does not indicate that a concurrent data transfer will occur, the data transfers will in fact occur with the timings as anticipated and in these situations there is no need to generate the revised timing information.

Whilst the above describes burst transfers (i.e. more than one data value is transferred), it will be appreciated that single transfers can also be modelled.

FIGS. 5A to 5D are flow diagrams illustrating in more detail the operation of the main components of the SystemC model 150. The following description assumes an arbitration scheme requiring that once a data transfer has been initiated by a master logic unit, it can not be interrupted. However, it will be appreciated that alternative arbitration schemes could be supported such as, for example, enabling burst transfers to be interrupted by other master logic units or enabling burst transfers to be interleaved by two or more logic units. This would be achieved by interrupting the wait for transmission period of the relevant models and by adjusting the operation of the arbitration model to reflect the supported arbitration scheme. Also, it will be appreciated that whilst the master logic unit model in this embodiment only completes part of anticipated timing information of the transaction data structure and allows the slave logic unit model to complete the remainder of the anticipated timing information of the transaction data structure, the master logic unit model could instead be arranged to complete all anticipated timing information to reflect embodiments where the master logic unit controls not only when a request is sent to the slave logic unit but also controls when the slave logic unit should reply to that request.

Figure 5A:
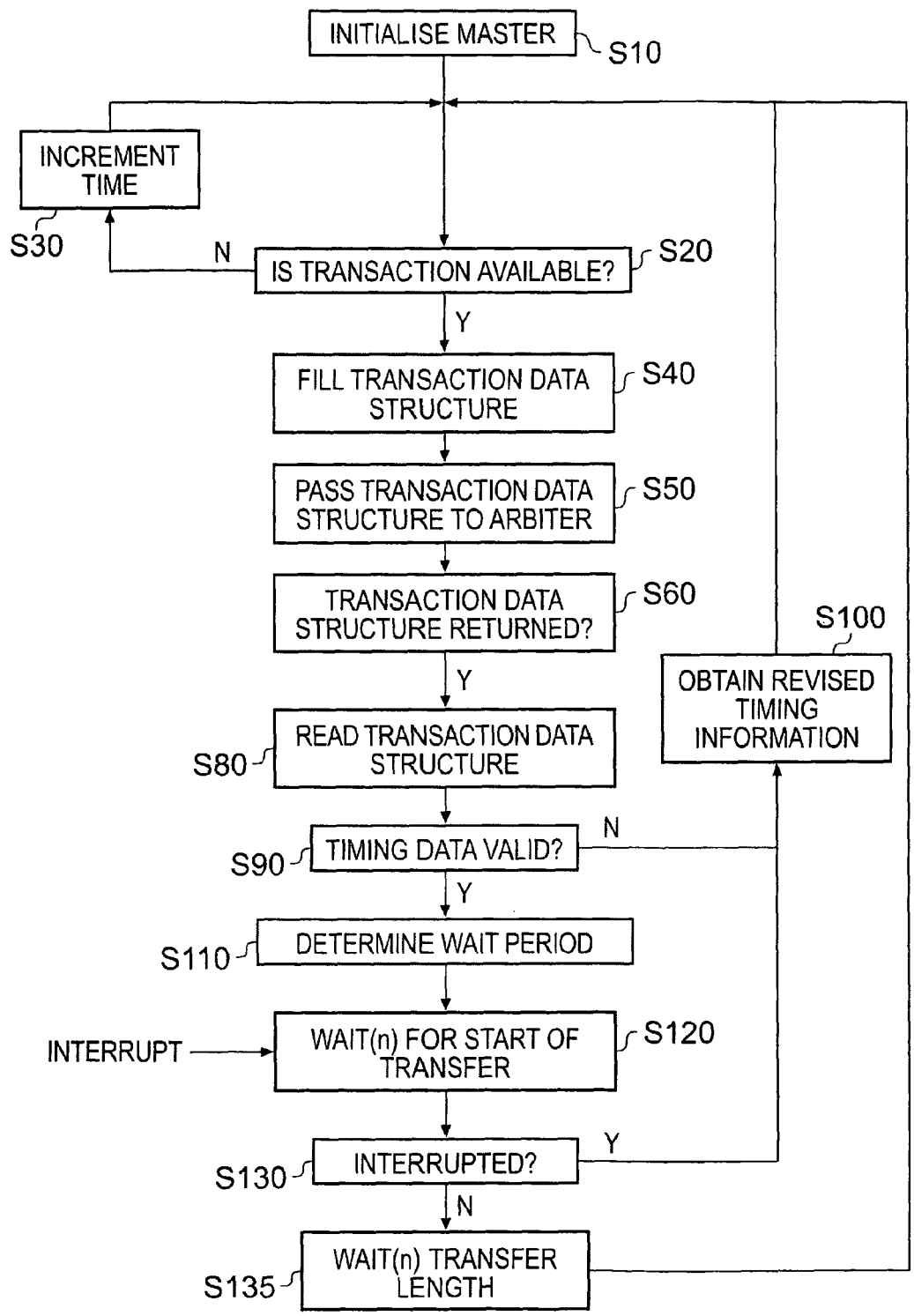
FIG. 5A is a flow diagram illustrating the operation of a master model.

FIG. 5A is a flow diagram illustrating the operation of a master logic unit model. Each of the master logic unit models will operate essentially in the same way. At step s10 the master logic unit model is initialised.

At step s20 the master logic unit model determines whether or not it has been informed by a function call that a transaction is available. If no transaction is available then at step s30 a simulated clock cycle timer is incremented and processing returns to step s20. If a transaction is available then processing proceeds to step s40 where a function call will be made to the associated timing model to generate anticipated timing information for the data transfer and the programmers view model will complete the appropriate fields of the transaction data structure in dependence on the instruction to be simulated. Upon completion of the appropriate fields of the transaction data structure processing proceeds to step s50 where the transaction data structure is passed to the arbiter model. It will be appreciated that whilst the data itself could be passed to the arbiter model it is in fact preferable to pass a pointer indicating the location of the transaction in main memory from the master logic unit model to the arbiter model.

At step s60 the transaction data stricture is returned following completion of the appropriate fields of the transaction data structure by a slave logic unit model and the arbiter model.

Once the transaction data structure has been returned then at step s80 the master logic unit model will read the transaction data structure and at step s90 determine whether the timing data within the transaction data structure is valid or not by interrogating the value stored in the valid field. If the valid field indicates that the timing data is not valid then processing proceeds to step s100 where revised timing information will be obtained using the timing models as will be described in more detail below with reference to FIG. 5D. If the valid field indicates that the timing data is valid then processing proceeds to step s110 where the master logic unit model will determine from the transaction data structure a period of simulated clock cycles that the master logic unit model should wait until the start of a transfer. At step s120 the master logic unit model will then wait for the period until the start of the transfer. For example, referring to transaction $T_1$ of FIG. 4, the master logic unit will wait until simulated clock cycle 2.

At step s130 a determination is made as to whether the wait period was interrupted. If the wait period was not interrupted then at step s135 the master logic unit will wait for a period until the data transfer completes. For example, referring to transaction $T_1$ of FIG. 4, the master logic unit will wait until simulated clock cycle 28 because the arbitration scheme in this embodiment dictates that once the data transfer has commenced it can not be interrupted. Thereafter, processing returns to step s20 where the master logic unit model determines whether the next transaction is available. If the determination at step s130 indicates that the wait period was interrupted then processing proceeds to step 100 since, as will be explained in more detail below, the interrupt will have occurred because a concurrent data transfer is expected to take place and so revised timing information needs to be generated for the data transfer. Once the revised timing information has been generated then the processing proceeds back to step s20 where the master logic unit model waits for the next transaction to become available.

Figure 5B:
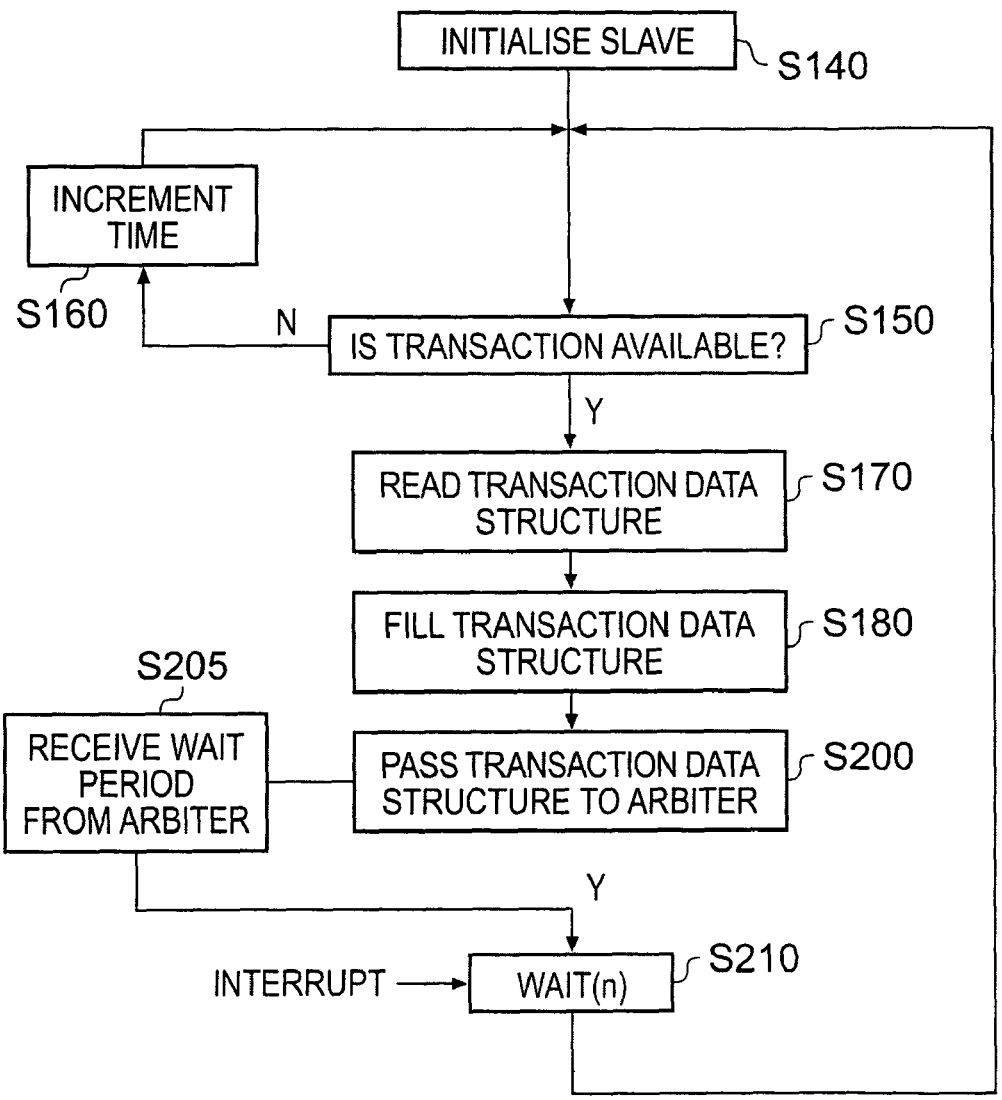
FIG. 5B is a flow diagram illustrating the operation of a slave model.

FIG. 5B is a flow diagram illustrating the operation of a slave logic unit model. Each slave logic unit model will operate in essentially the same way. At step s140 the slave logic unit model is initialised.

Thereafter, at step s150 the slave logic unit model waits for function call to be made indicating that a transaction is available. If no transaction is available then a timer is incremented at step 160 by one simulated clock cycle and processing returns to step 150 to determine whether a transaction is now available. If a transaction is available then processing proceeds to step s170 where the transaction data structure is read.

Thereafter, at step s180 the slave logic unit model will complete the appropriate fields of the transaction data structure based on information provided by its programmers view model and its timing model.

The transaction data structure is then transferred at step s200 to the arbiter model. The arbiter model determines a wait period for the slave logic unit model from the transaction data structure and the slave logic unit model receives the wait period at step s205. The wait period is typically the period of time during which the data transfer is expected to occur. For example, referring to transaction $T_1$ of FIG. 4, the slave logic unit will also wait until simulated clock cycle 28.

Thereafter, at step s210 the slave logic unit model will wait for the determined period unless it is interrupted beforehand. Following the completion of the wait period or in the event that the wait period is interrupted then processing returns to step s150 to await the next transaction.

Figure 5C:
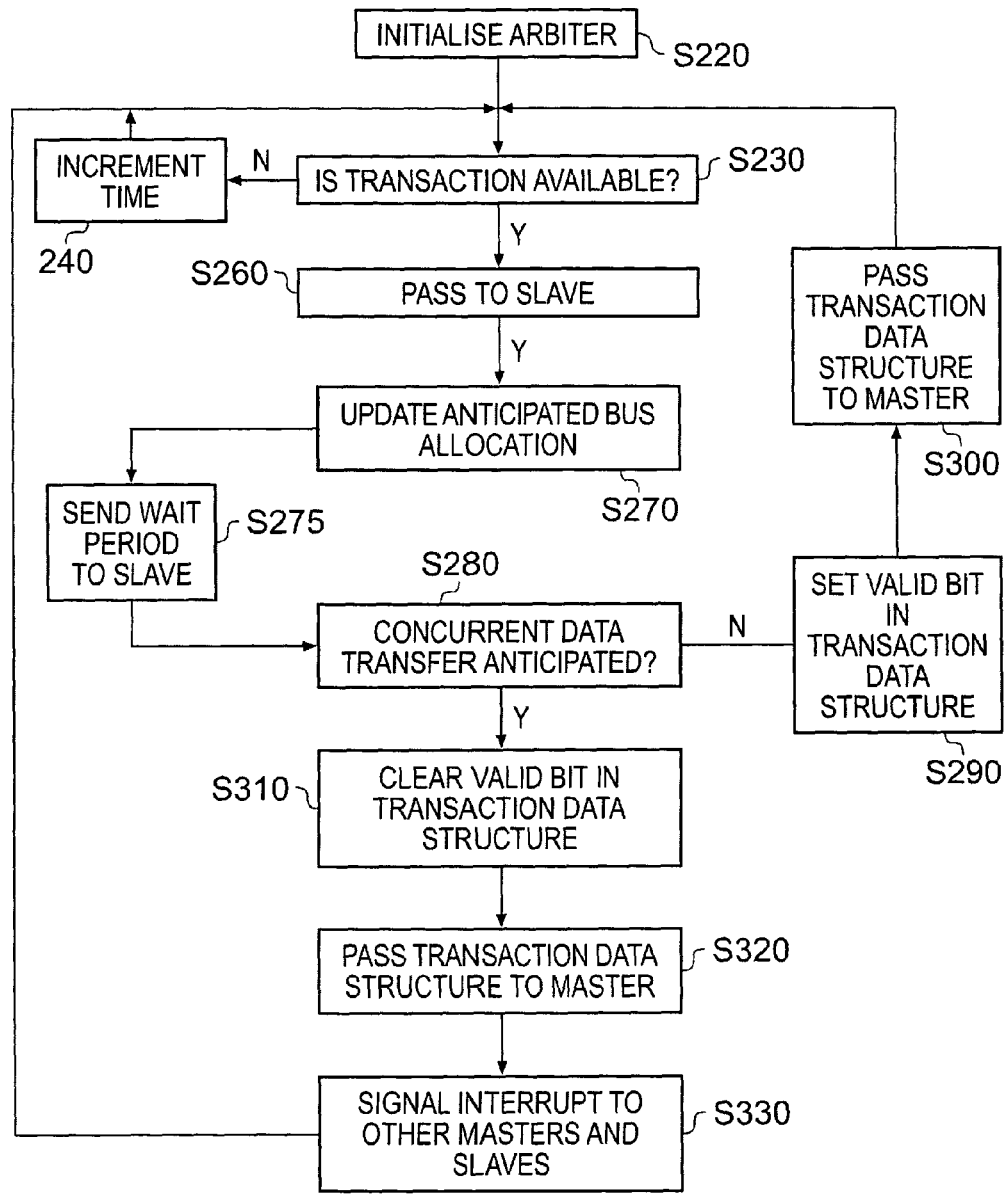
FIG. 5C is a flow diagram illustrating the operation of an arbiter model.

FIG. 5C is a flow diagram illustrating the operation of the arbiter model. At step s220 the arbiter model is initialised.

At step s230 the arbiter model determines whether a transaction is available. If no transaction is available then at step s240 a timer is incremented and processing returns to step s230 to determine whether a transaction is now available.

In the event that a transaction is available then at step s260 the arbiter passes the transaction data structure to the relevant slave logic unit model which fills the relevant anticipated timing information in the transaction data structure. Thereafter, at step s270, the arbiter model reads the transaction data structure and an anticipated bus allocation table to indicate when the bus is anticipated to be allocated to perform a data transfer. The arbiter model then indicates the wait period to the slave logic unit model. As mentioned above, the wait period is typically the period of time during which the data transfer is expected to occur. For example, referring to transaction $T_1$ of FIG. 4, the slave logic unit will also wait until simulated clock cycle 28.

Thereafter, at step s280 the arbiter model will determine whether any concurrent data transfers are anticipated by reviewing the bus allocation table. In the event that no concurrent data transfers are expected then processing proceeds to step s290 whereby the arbiter model will set the valid field in the data transaction structure to "true" and then at step s300 when the transaction data structure is passed back to the master logic unit model. Thereafter, processing will return to step s230 to determine whether another transaction is available.

In the event that a concurrent data transfer is anticipated then the valid field in the transaction data structure will be cleared to "false" and at step s320 the transaction data structure will be passed back to the relevant master logic unit model. Thereafter, at step s330 the arbiter model will signal an interrupt to all master logic unit models and slave logic unit models which may be waiting and processing will return to step s230 to determine whether the next transaction is available.

Figure 5D:
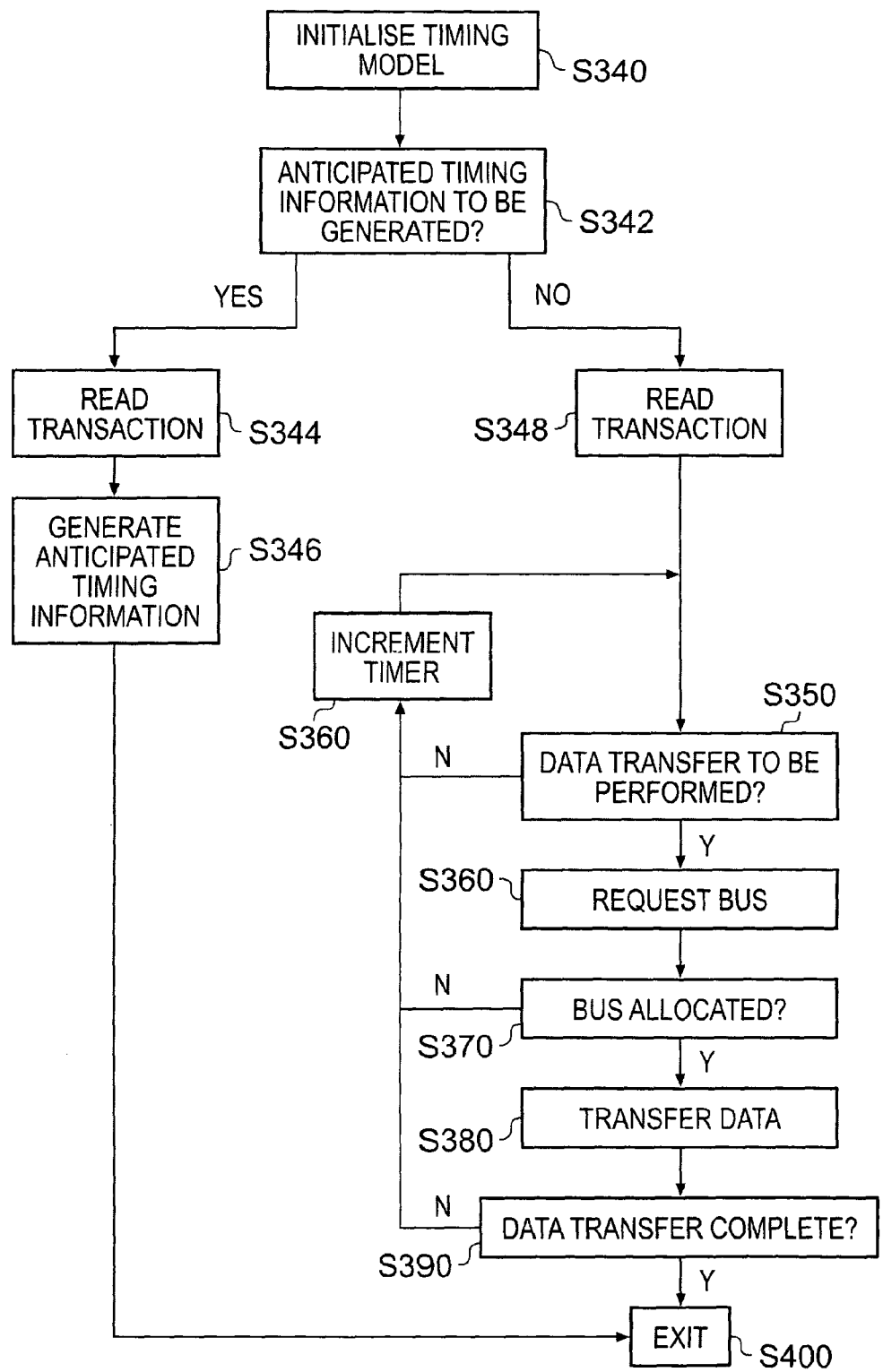
FIG. 5D is a flow diagram illustrating the operation of a timing model.

FIG. 5D is a flow diagram illustrating the operation of each timing model. At step s340 the model is initialised. At step s342, a determination is made as to whether anticipated timing information is to be generated based upon the nature of the function call made by the associated programmers view model.

If anticipated timing information is to be generated then at step s344 the transaction is read to determine the type of data transfer required to be simulated. From the information provided in the transaction the anticipated timing information can be generated. For example, for the transaction $T_1$ mentioned above, the timing model is programmed to be able to determine that following receipt of an instruction which will cause the master logic unit to read four, 8-bit data values from a memory location of a slave logic unit, the master logic unit is able to generate request signals at the current clock cycles +2, 4, 6 and +8 respectively for the four data transfers, these anticipated timings simulating the time taken for the master logic unit to process the instruction and to assert the relevant signals on the bus. Similarly, for the transaction $T_2$ mentioned above, the timing model is programmed to be able to determine that following receipt of an instruction which will cause the master logic unit to write two, 16-bit data values to a memory location of a slave logic unit, the slave logic unit is able to generate acknowledge signals 30 clock cycles following receipt of the request signals, these anticipated timings simulating the time taken for the slave logic unit to receive, store and validate the data and to assert the acknowledge signal on the bus. Thereafter, processing proceeds to step s400 where the timing model is exited.

If revised timing information is to be generated then processing proceeds to step s348 where revised timing information can be generated on a cycle by cycle basis. The transaction is read to determine the type of instruction for which revised timing information is to be generated and to determine the anticipated status of the bus.

At step s350 it is determined whether for the current simulated clock cycle a data transfer is to be performed. In the event that no data transfer is to be performed then at step s360 the timer is incremented and processing returns to step s350 to determine whether a data transfer is to be performed. In the event that a data transfer is to be performed then the bus is requested at step s360 and at step s370 it is determined whether the bus has been allocated to that logic unit. The determination is made by a bus allocation model within the arbitration model which receives bus requests from various timing models and will allocate the bus to one of the requesting logic units to enable a data transfer to take place. In this embodiment, the bus allocation model will allocate the bus to a master logic unit for the duration of a data transfer. However, as mentioned above, other arbitration schemes could equally be supported.

In the event that the bus has not been allocated to that logic unit then processing proceeds to step s360 where the timer is incremented by one simulated clock cycle. At step s350 it is determined whether a data transfer is to be performed.

In the event that the bus has been allocated then at step s380 data is transferred. Thereafter, at step s390 it is determined whether the whole data transfer has been completed. In the event that the data transfer has not been completed then processing proceeds to step s360 where the timer is incremented by one simulated clock cycle. At step s350 it is determined whether a data transfer is to be performed. In the event that the data transfer has been completed then processing proceeds to step s400 where the timing model is exited. It will be appreciated that the timing model could be arranged to update the transaction with the revised timing information for that data transfer if required.

Accordingly, it can be seen that with the above-described arrangement the operation of a data processing apparatus can be simulated. When a data transfer is to occur, a transaction is generated which is partially completed by a master logic unit model in conjunction with a timing model which generates expected timing information for the data transfer. Because, in a relatively large number of cases, the data transfer will occur with exclusive access to the bus, there is no need to generate the timing information by simulating in detail every signal that each logic unit will assert on a cycle-by-cycle basis since the likely outcome is already known, namely that the requesting logic unit will gain exclusive access to the bus and the data transfer will occur as expected. Accordingly, because the generation of the timing information is significantly simplified, the overall performance of the software model is significantly increased. However, the anticipated timing information can also be used to test whether or not this assumption is correct. In the event that the anticipated timing information indicates that concurrent data transfers are expected to occur, meaning that the anticipated timing information is inaccurate, revised timing information can then be generated by the timing models simulating the bus signals on a cycle-by-cycle basis in order to determine which of the data transfers will occur on the bus at any particular clock cycle until those data transfers have been completed. Thereafter, the software model can revert to the more efficient technique of generating anticipated timing information for subsequent data transfers until concurrent data transfers are expected, and so on. Hence, it can be seen that through this approach, accurate timing information can efficiently be generated since the software model is executed in one of two ways, each optimised for the particular scenario to be simulated.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A method of simulating the operation of a data processing apparatus to determine timing information of data transfers, the data processing apparatus comprising a number of master logic units and slave logic units coupled via a bus, the data processing apparatus being configured to perform the data transfers between the master logic units and the slave logic units over the bus, the method comprising the steps of:
   a) generating anticipated timing information for each successive data transfer over the bus by assuming that each successive data transfer can occur with exclusive access to the bus;
   b) determining whether the anticipated timing information indicates that two or more concurrent data transfers would occur on the bus; and
   c) in the event that the anticipated timing information indicates that two or more concurrent data transfers would occur on the bus, generating machine-readable revised timing information for those data transfers for use in correcting said anticipated timing information as part of simulation output results, the revised timing information being generated using bus status information until those data transfers have been completed.

2. The method as claimed in claim 1, wherein the step a) further comprises the step of generating anticipated timing information for each successive data transfer between one master logic unit and one slave logic unit over the bus to which that master logic unit and that slave logic unit have exclusive access.

3. The method as claimed in claim 1, wherein the anticipated timing information comprises a data transfer window indicative of a speculative time during which that data transfer is predicted will occur over the bus.

4. The method as claimed in claim 1, wherein the anticipated timing information comprises data transfer commencement information indicative of the time at which that data transfer will commence on the bus and data transfer completion information indicative of the time at which that data transfer will complete on the bus.

5. The method as claimed in claim 1, wherein each data transfer comprises the transfer of a number of data values over the bus and the anticipated timing information comprises data value transfer information indicative of the time at which each data value will be transferred over the bus.

6. The method as claimed in claim 1, wherein the step b) further comprises the step of comparing the anticipated timing information for each successive data transfer to determine whether two or more concurrent data transfers would occur on the bus.

7. The method as claimed in claim 6, wherein the step b) further comprises the step of determining whether two or more concurrent data transfers would occur on the bus by determining whether the anticipated timing information indicates that one data transfer will not complete prior to another data transfer commencing.

8. The method as claimed in claim 1, wherein the step c) further comprises the step of generating bus status information indicative of the status of the bus during at least a period when the anticipated timing information indicates that two or more concurrent data transfers would occur on the bus.

9. The method as claimed in claim 8, wherein the bus status information includes information indicative of which master logic unit/slave logic unit pair have access to the bus at any point in time during at least the period.

10. The method as claimed in claim 8, wherein the step c) further comprises the step determining from the generating bus status information which of those data transfers will occur on the bus at any point in time during at least the period.

11. The method as claimed in claim 9, wherein the step c) further comprises the step of generating revised timing information indicative of the time during which each of those data transfers occur over the bus.

12. A method of simulating the operation of a data processing apparatus using a software model to determine timing information of data transfers, the data processing apparatus comprising a number of master logic units and slave logic units coupled via a bus, the data processing apparatus being configured to perform the data transfers between the master logic units and the slave logic units over the bus, the method comprising the steps of:
   a) in response to an indication that a data transfer is to occur, generating data transfer information indicative of the data transfer using a master logic unit model and a slave logic unit model;
   b) generating anticipated timing information from the data transfer information using the master logic unit model and the slave logic unit model, the anticipated timing information being generated by assuming that the data transfer will occur with exclusive access to the bus;
   c) determining from the anticipated timing information whether two or more concurrent data transfers will occur on the bus; and
   d) in the event that is it anticipated that two or more concurrent data transfers will occur on the bus, generating machine-readable revised timing information for those data transfers using the master logic unit model and the slave logic unit model, the revised timing information being generated by modelling the status of the bus during at least the period when it is anticipated that two or more concurrent data transfers will occur.

13. The method as claimed in claim 12, wherein the data transfer information includes information indicative of the type and size of data transfer.

14. The method as claimed in claim 12, wherein the step b) comprises generating anticipated timing information comprising timing values generated by the master logic unit model and the slave logic unit model indicative of a speculative time during which that data transfer is predicted will occur over the bus.

15. The method as claimed in claim 12, wherein the step b) comprises generating anticipated timing information comprising data transfer commencement information using the master logic unit model, the data transfer commencement information being indicative of the time at which that data transfer will commence on the bus and generating data transfer completion information using the slave logic unit model, the data transfer completion information being indicative of the time at which that data transfer will complete on the bus.

16. The method as claimed in claim 12, wherein each data transfer comprises the transfer of a number of data values over the bus and the step b) comprises generating anticipated timing information comprising data value transfer information indicative of the time at which each data value will be transferred over the bus.

17. The method as claimed in claim 12, wherein the step c) further comprises the step of comparing the anticipated timing information for each successive data transfer using a arbiter model to determine whether two or more concurrent data transfers would occur on the bus.

18. The method as claimed in claim 17, wherein the step c) further comprises the step of determining whether two or more concurrent data transfers would occur on the bus by determining whether the anticipated timing information indicates that one data transfer will not complete prior to another data transfer commencing.

19. The method as claimed in claim 12, further comprising the step of:
   generating a transaction including the data transfer information.

20. The method as claimed in claim 19, wherein the steps a) and b) comprise the steps of:
   generating master data transfer information and master anticipated timing information from the data transfer information using a master logic unit model;
   storing the master data transfer information and the master anticipated timing information in the transaction;
   passing the transaction to the slave logic unit model;
   generating slave data transfer information and slave anticipated timing information from the data transfer information using a slave logic unit model; and
   storing the slave data transfer information and the slave anticipated timing information in the transaction.

21. The method as claimed in claim 19, wherein the step c) further comprises the steps of:
   passing the transaction to an arbiter model;
   updating a bus allocation table with the anticipated timing information in the transaction;
   determining from the bus allocation table whether two or more concurrent data transfers are anticipated to occur.

22. The method as claimed in claim 19, wherein in the event that is it anticipated that two or more concurrent data transfers will occur the step d) further comprises the step of:
   causing each master logic unit model and slave logic unit model associated with the two or more concurrent data transfers to initialise timing models configured to simulate bus signals generated by each of the corresponding master logic units and slave logic units on a clock cycle by clock cycle basis.

23. The method as claimed in claim 22, wherein in the event that is it anticipated that two or more concurrent data transfers will occur the step d) further comprises the steps of:
   setting a current clock cycle from which the bus signals are to be simulated;
   initialising the timing models based on the current clock cycle and using anticipated timing information within the transactions associated with the two or more concurrent data transfers.

24. The method as claimed in claim 22, wherein in the event that is it anticipated that two or more concurrent data transfers will occur the step d) further comprises the step of:
   determining, using an arbiter model and based on the simulated bus signals, which of the master logic unit models and slave logic unit models will be allocated access to the bus during any particular clock cycle.

25. The method as claimed in claim 24, wherein in the event that is it anticipated that two or more concurrent data transfers will occur the step d) further comprises the step of:
   signalling the master logic unit models and slave logic unit models with the outcome of the determination.

26. The method as claimed in claim 25, wherein in the event that is it anticipated that two or more concurrent data transfers will occur the step d) further comprises the step of:
   on receipt of a signal indicating to a master logic unit model or slave logic unit model that access to the bus has been granted, generating the revised timing information indicative of the actual clock cycles over which the data transfer occurred.

27. The method as claimed in claim 22, wherein once the revised timing information has been generated for two or more concurrent data transfers, simulating bus signals generated by each of the corresponding master logic units and slave logic units on a clock cycle by clock cycle basis is suspended.

28. The method as claimed in claim 12, wherein in the event that is it anticipated that two or more concurrent data transfers will not occur, the step d) further comprises the step of:
causing the associated master logic unit model and slave logic unit model to remain inactive for the period of the data transfer.

29. Apparatus for simulating the operation of a data processing apparatus to determine timing information of data transfers, the data processing apparatus comprising a number of master logic units and slave logic units coupled via a bus, the data processing apparatus being configured to perform the data transfers between the master logic units and the slave logic units over the bus, the apparatus comprising a computer for executing a plurality of software models including:
a master logic unit software model and a slave logic unit software model each being configured, in response an indication that a data transfer is to occur, to generate data transfer information indicative of the data transfer, the master logic unit software model and the slave logic unit software model being further configured:
in a default mode to generate anticipated timing information from the data transfer information, the anticipated timing information being generated by assuming that the data transfer will occur with exclusive access to the bus, and
in a selected mode, when it is anticipated that two or more concurrent data transfers will occur on the bus, to generate computer-readable revised timing information for those data transfers for use in correcting said anticipated timing information as part of simulation output results, the revised timing information being generated by modelling the status of the bus during at least the period when it is anticipated that the two or more concurrent data transfers will occur; and
a bus software model configured to determine from the anticipated timing information whether two or more concurrent data transfers will occur and, when it is anticipated that two or more concurrent data transfers will occur, to signal the master logic unit software model and the slave logic unit software model to switch from the default mode to the selected mode.

30. The apparatus as claimed in claim 29, wherein the data transfer information includes information indicative of the type and size of data transfer.

31. The apparatus as claimed in claim 29, wherein the master logic unit software model and the slave logic unit software model are configured to generate anticipated timing information comprising timing values indicative of a speculative time during which that data transfer is predicted will occur over the bus.

32. The apparatus as claimed in claim 29, wherein the master logic unit software model is configured to generate anticipated timing information comprising data transfer commencement information, the data transfer commencement information being indicative of the time at which that data transfer will commence on the bus and the slave logic unit software model is configured to generate anticipated timing information comprising data transfer completion information, the data transfer completion information being indicative of the time at which that data transfer will complete on the bus.

33. The apparatus as claimed in claim 29, wherein each data transfer comprises the transfer of a number of data values over the bus and the master logic unit software model and the slave logic unit software model are configured to generate anticipated timing information comprising data value transfer information indicative of the time at which each data value will be transferred over the bus.

34. The apparatus as claimed in claim 29, wherein the arbiter model is configured to compare the anticipated timing information for each successive data transfer to determine whether two or more concurrent data transfers would occur on the bus.

35. The apparatus as claimed in claim 34, wherein the arbiter model is configured to determine whether two or more concurrent data transfers would occur on the bus by determining whether the anticipated timing information indicates that one data transfer will not complete prior to another data transfer commencing.

36. The apparatus as claimed in claim 29, wherein the master logic unit software model and the slave logic unit software model are configured to generate a transaction including the data transfer information.

37. The apparatus as claimed in claim 36, wherein the master logic unit model is configured to generate master data transfer information and master anticipated timing information from the data transfer information and to store the master data transfer information and the master anticipated timing information in the transaction and the slave logic unit model is configured to generate slave data transfer information and slave anticipated timing information from the data transfer information and to store the slave data transfer information and the slave anticipated timing information in the transaction.

38. The apparatus as claimed in claim 37, wherein the arbiter model is configured to update a bus allocation table with the anticipated timing information in the transaction and to determine from the bus allocation table whether two or more concurrent data transfers are anticipated to occur.

39. The apparatus as claimed in claim 36, wherein in the event that is it anticipated that two or more concurrent data transfers will occur, each master logic unit model and slave logic unit model associated with the two or more concurrent data transfers are configured to initialise timing models configured to simulate bus signals generated by each of the corresponding master logic units and slave logic units on a clock cycle by clock cycle basis.

40. The apparatus as claimed in claim 39, wherein in the event that is it anticipated that two or more concurrent data transfers will occur each master logic unit model and slave logic unit model associated with the two or more concurrent data transfers are configured to set a current clock cycle from which the bus signals are to be simulated, to initialise the timing models based on the current clock cycle and to use anticipated timing information within the transactions associated with the two or more concurrent data transfers.

41. The apparatus as claimed in claim 39, wherein in the event that is it anticipated that two or more concurrent data transfers will occur the arbiter model is configured to determine, based on the simulated bus signals, which of the master logic unit models and slave logic unit models will be allocated access to the bus during any particular clock cycle.

42. The apparatus as claimed in claim 41, wherein in the event that is it anticipated that two or more concurrent data transfers will occur the arbiter model is configured to signal the master logic unit models and slave logic unit models with the outcome of the determination.

43. The apparatus as claimed in claim 42, wherein in the event that is it anticipated that two or more concurrent data transfers will occur the master logic unit model or slave logic unit model receiving a signal indicating that access to the bus has been granted is configured to generate the revised timing information indicative of the actual clock cycles over which the data transfer occurred.

44. The apparatus as claimed in claim 39, wherein once the revised timing information has been generated for two or more concurrent data transfers the operation of the timing models is suspended.

45. The apparatus as claimed in claim 29, wherein in the event that is it anticipated that two or more concurrent data transfers will not occur, the associated master logic unit model and slave logic unit model are instructed to remain inactive for the period of the data transfer.

46. A computer program storage medium storing a computer program for simulating the operation of a data processing apparatus to determine timing information of data transfers, the data processing apparatus comprising a number of master logic units and slave logic units coupled via a bus, the data processing apparatus being configured to perform the data transfers between the master logic units and the slave logic units over the bus, the computer program comprising:

- a master logic unit software model and a slave logic unit software model each being configured, in response an indication that a data transfer is to occur, to generate data transfer information indicative of the data transfer, the master logic unit software model and the slave logic unit software model being further configured
- in a default mode to generate anticipated timing information from the data transfer information, the anticipated timing information being generated by assuming that the data transfer will occur with exclusive access to the bus and
- in a selected mode, when it is anticipated that two or more concurrent data transfers will occur on the bus, to generate machine-readable revised timing information for those data transfers for use in correcting said anticipated timing information as part of simulation output results, the revised timing information being generated by modelling the status of the bus during at least the period when it is anticipated that the two or more concurrent data transfers will occur; and
- a bus software model configured to determine from the anticipated timing information whether two or more concurrent data transfers will occur and, when it is anticipated that two or more concurrent data transfers will occur, to signal the master logic unit software model and the slave logic unit software model to switch from the default mode to the selected mode.

\* \* \* \* \*